United States Patent

Seo et al.

[11] Patent Number: 5,858,149
[45] Date of Patent: Jan. 12, 1999

[54] PROCESS FOR BONDING SEMICONDUCTOR CHIP

[75] Inventors: Seong Min Seo; Jae Hwan Song, both of Seoul, Rep. of Korea

[73] Assignees: Anam Semiconductor Inc., Seoul, Rep. of Korea; Amkor Technology, Inc., Chandler, Ariz.

[21] Appl. No.: 749,578

[22] Filed: Nov. 14, 1996

[30] Foreign Application Priority Data

Nov. 21, 1995 [KR] Rep. of Korea ........................ 95 42561

[51] Int. Cl.⁶ .................................................. H01L 24/08
[52] U.S. Cl. ................................ 156/150; 427/96; 29/740
[58] Field of Search ............................. 156/150; 427/96; 29/740

[56] References Cited

U.S. PATENT DOCUMENTS 5,128,746  7/1992  Pennisi et al. ........................ 257/738
5,353,498  10/1994  Fillion et al. ........................ 29/840

*Primary Examiner*—Francis J. Lorin
*Attorney, Agent, or Firm*—Skjerven Morrill MacPherson Franklin & Friel LLP; Thomas S. MacDonald

[57] ABSTRACT

An improved process for bonding a semiconductor chip to a substrate is disclosed. In the process, a gold bump is formed on an aluminum bond pad of the chip thus forming a flip chip. A screen with an opening is placed on the substrate prior to dotting insulating epoxy on the opening. The epoxy is bladed with a printing blade thus forming an epoxy layer having a predetermined area and uniform thickness. The flip chip is, thereafter, placed on the substrate such that the gold bump is brought into electrical contact with a lead finger of the substrate through thermocompression bonding. Then the chip and substrate are put in an oven in order to permanently cure the epoxy layer. It is preferable to precure the epoxy layer prior to the permanent curing step thereby allowing thermal stress to be distributed to both the gold bump and the precured epoxy layer.

4 Claims, 4 Drawing Sheets

PROCESS FOR BONDING SEMICONDUCTOR CHIP

BACKGROUND OF THE INVENTION

1. Field of the Invention

The present invention relates in general to a process for bonding a semiconductor chip to a substrate and, more particularly, to a chip bonding process for bonding a flip chip, that has a bump on its bond pad, to the substrate while turning the flip chip over to direct the bump surface of the chip downward.

2. Description of the Prior Art

FIGS. 1A to 1F show a typical process for bonding a flip chip 1 to a substrate 30. As shown in the drawings, the typical chip bonding process is started by a flip chip forming step. In the flip chip forming step, a gold (Au) bump 20 is formed on the aluminum bond pad 11 of a semiconductor chip 10 thereby forming the flip chip 1 as shown in FIGS. 1A to 1C. The flip chip forming step is followed by an electrical contact step. In the above electrical contact step, the flip chip 1 is placed relative to the substrate 30 such that the gold bump 20 of the chip 1 is aligned with a lead finger 31 of the substrate 30. The gold bump 20 is, thereafter, bonded to the lead finger 31 using a reflow process as shown in FIG. 1D. Thereafter, an underfilling step is carried out. In the above underfilling step, epoxy 40 is injected from the edge of the semiconductor chip 10 in order to fill the gap between the chip 10 and the substrate 30 as shown in FIG. 1E. The epoxy 40 in the gap between the chip 10 and substrate 30 not only relieves thermal stress of the chip 1, it also protects the electrical contact between the semiconductor circuit and chip 10 and the substrate 30. The underfilling step is followed by a curing step. In the above curing step, both the flip chip 1 and the substrate 30 with the epoxy 40 charged in the gap therebetween is put in an oven prior to permanently curing the epoxy 40 in the oven as shown in FIG. 1F.

However, the above chip bonding process has the following problems. That is, since the epoxy 40 is injected from the edge of the chip 10, the air in the gap between the chip 10 and substrate 30 fails to be completely degassed. In this regard, voids may form in the epoxy 40. In addition, it is difficult to relieve the thermal stress applied to the gold bump 20 during and just after the flip chip bonding process. The above thermal stress may cause deformations or cracks on the bump 20 thereby reducing the quality of the resulting semiconductor packages and reducing the production yield of the packages.

In accordance with another typical embodiment, optical-curing resins may be applied to the substrate by a dispenser after the flip chip forming step. After applying the optical-curing resins, the bump of the semiconductor chip is aligned with the electrode of the substrate prior to radiating ultra-violet rays to the resins while compressing the chip with a compressing jig, thereby curing the optical-curing resins.

However, the above chip bonding process according to the other typical embodiment has the following problems. That is, the optical-curing resins are applied to the substrate by the dispenser under different resin applying conditions, so the thickness of the optical-curing resins at the edge of the semiconductor chip is not uniform. Therefore, neither the deposited state of the optical-curing resins nor the height of the resins from the substrate's surface at different positions can be uniformed. The semiconductor chip thus comes into contact with the optical-curing resins having the different state and height as the chip and substrate are compressed together by the compressing jig. Therefore, the air between the bump of the semiconductor chip and the substrate cannot be completely degassed but remains in the optical-curing resins thereby forming voids in the resins after optically curing the resins. Such voids may cause cracks in the chip, reducing the quality of the resulting semiconductor packages.

SUMMARY OF THE INVENTION

It is, therefore, a primary object of the present invention to provide a process for bonding a semiconductor chip in which the above problems can be overcome and which forms a flip chip by welding a gold bump on a semiconductor chip, uniformly applies insulating epoxy onto the lead finger of a substrate using a screen and blade in order to form an insulating epoxy layer having predetermined thickness and area, precures the epoxy layer of the substrate, and permanently cures the epoxy layer through thermocompression bonding while turning the flip chip over and placing the chip on the substrate with the precured epoxy layer.

It is another object of the present invention to provide a process for bonding a semiconductor chip which relieves thermal stress of the bump by applying a multi-stepped curing epoxy in the epoxy applying step and by performing a precuring step prior to performing the electrical contact step.

In order to accomplish the primary object, the present invention provides a process for bonding a semiconductor chip to a substrate comprising: a flip chip forming step for forming a gold bump on an aluminum bond pad of the semiconductor chip thereby forming a flip chip; an epoxy applying step for placing a predetermined thickness of screen with an opening on the substrate such that the opening is placed on a chip mounting portion of the substrate, dispensing insulating epoxy on the opening in order to dot the insulating epoxy on the substrate, and blading the epoxy with a printing blade in order to form an epoxy layer, having a predetermined area and uniform thickness, oil the substrate; an electrical contact step for placing the flip chip on the substrate with the epoxy layer such that the gold bump of the chip is brought into electrical contact with a lead finger of the substrate, and thermally compressing the chip and substrate together through thermocompression bonding in order to bond the chip to the substrate by the epoxy layer; and a permanent curing step for permanently curing the epoxy layer by putting the package in an oven.

In order to accomplish the other object, multi-stepped curing epoxy is used as the insulating epoxy in the above epoxy applying step, while a precuring step for precuring the epoxy layer is performed prior to the electrical contact step thereby allowing thermal stress generated during and just after the thermocompression bonding to be distributed to both the gold bump and the precured epoxy layer and preventing deformation or damage of the gold bump.

In accordance with the above chip bonding process of this invention, the epoxy layer having a predetermined area and uniform thickness can be formed on the substrate by blading epoxy applied on the substrate, so any void is not formed in the epoxy layer when mounting the chip to the substrate. In addition, the epoxy layer formed of multi-stepped curing epoxy is precured prior to being permanently cured. Therefore, thermal stress generated during and just after the thermocompression bonding step to be distributed to both the gold bump and the precured epoxy layer, thereby preventing deformation or damage of the gold bump and remarkably improving the quality and production yield of the resulting semiconductor packages.

BRIEF DESCRIPTION OF THE DRAWINGS

The above and other objects, features and other advantages of the present invention will be more clearly understood from the following detailed description taken in conjunction with the accompanying drawings, in which.

DESCRIPTION OF THE PREFERRED EMBODIMENTS

FIGS. 2A to 2F are views showing a process for bonding a flip chip to a substrate in accordance with a preferred embodiment of the present invention.

Figure 1A:
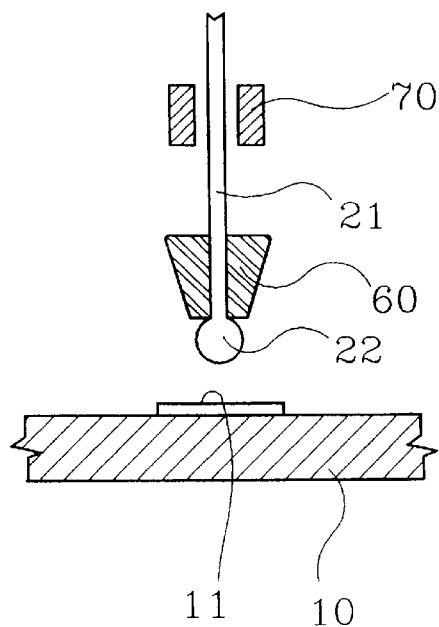
FIGS. 1A to 1F are views showing a typical process for bonding a flip chip to a substrate.
Figure 1B:
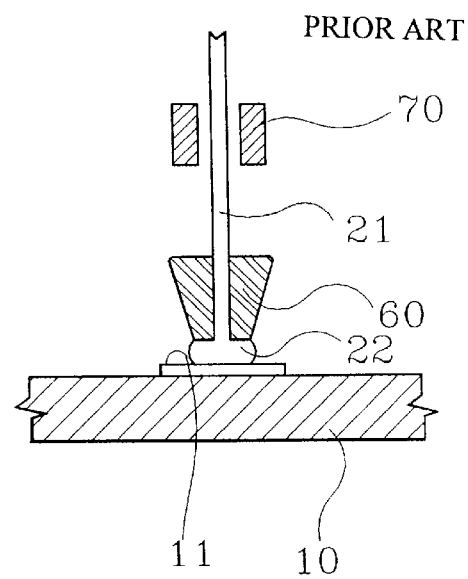
Figure 1C:
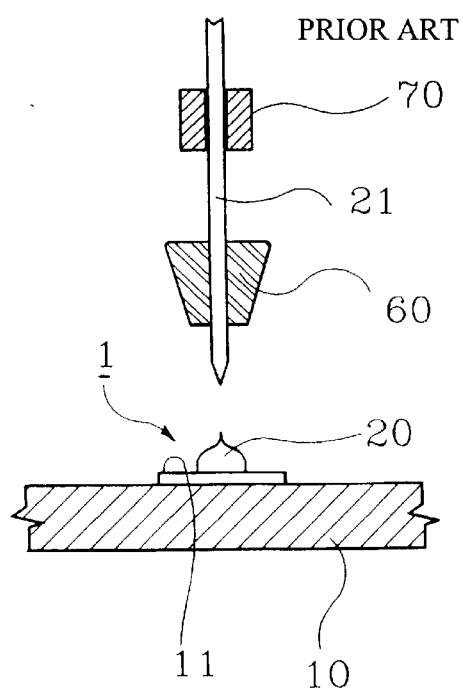
Figure 1D:
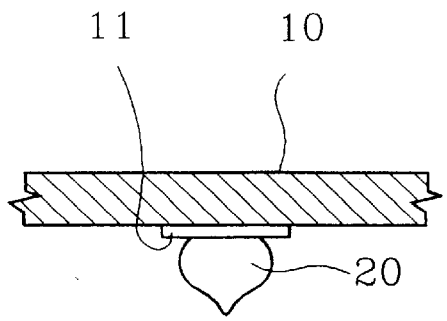
Figure 1E:
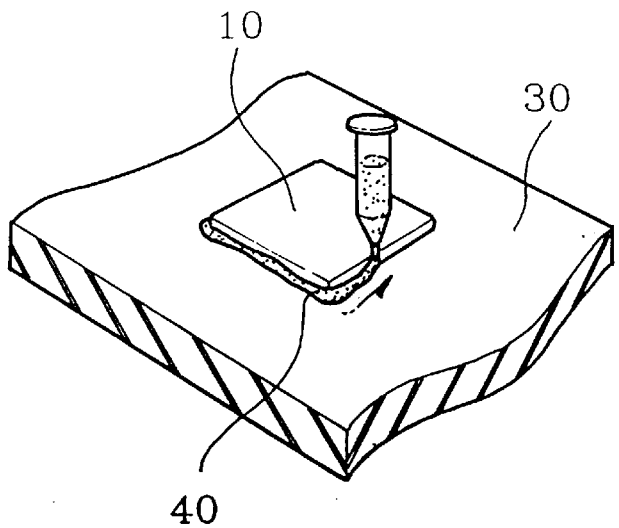
Figure 1F:
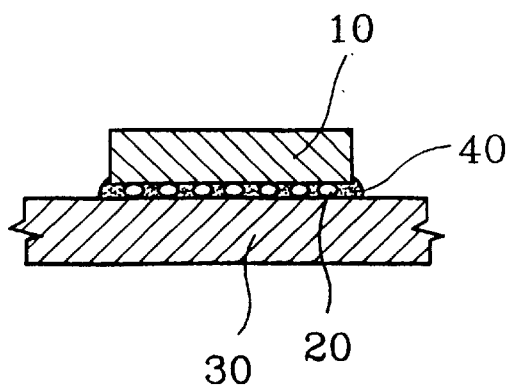
Figure 2A:
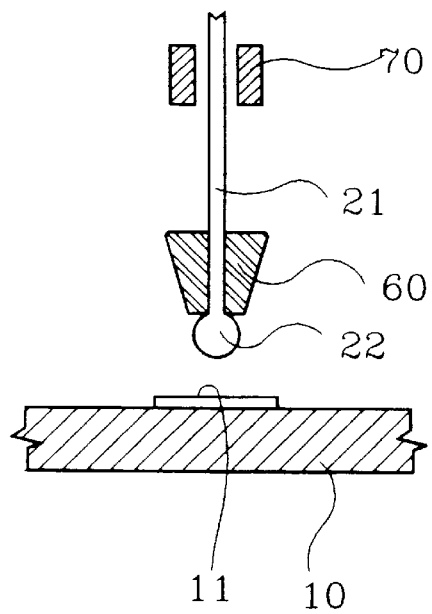
FIGS. 2A to 2F are views showing a process for bonding a flip chip to a substrate in accordance with a preferred embodiment of the present invention.
Figure 2B:
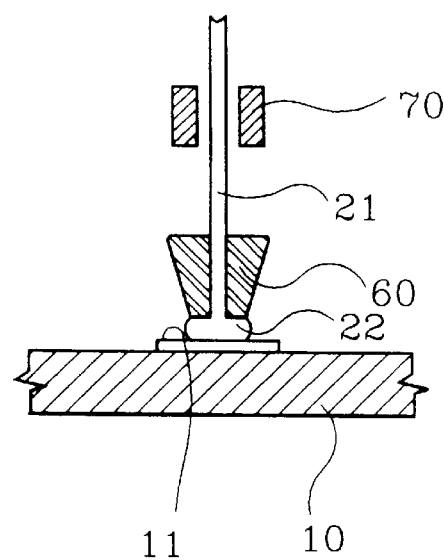
Figure 2C:
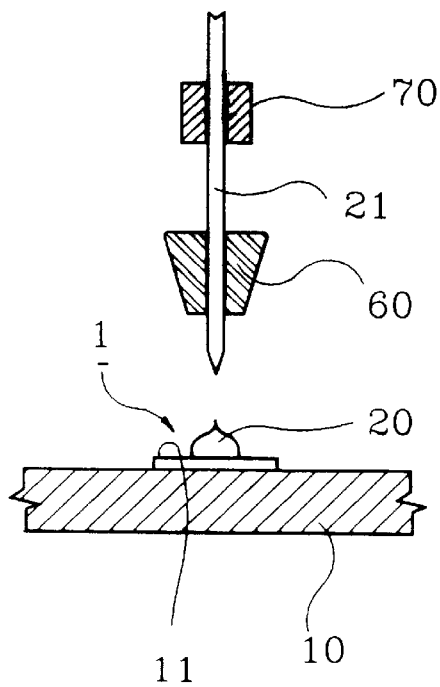

The chip bonding process of this invention is started by the flip chip forming step shown in FIGS. 1A to 1C. In the flip chip bonding step, a gold wire ball or bump 22 is formed by passing a gold wire 21 through the capillary 60 of a wire bonding device as shown in FIG. 2A. The gold wire bump 22 in turn is welded to the aluminum bond pad 11 formed on one side of a semiconductor chip 10 as shown in FIG. 2B. Thereafter, the gold wire 21 is cut by a wire clamp 70 at a portion of the wire 21 just above the welded bump 22, thereby forming a flip chip 1 having the gold bump 22 formed on the semiconductor chip 10 as shown in FIG. 2C.

Figure 2D:
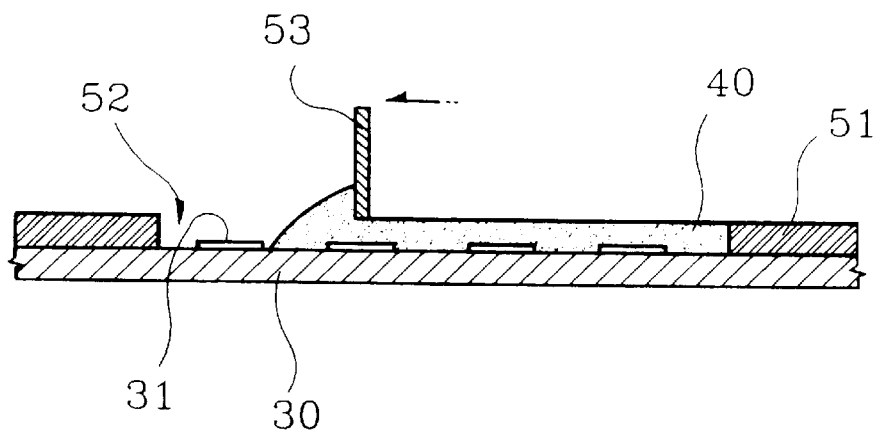

The above flip chip forming step is followed by an epoxy applying step. A predetermined thickness of screen 51 having an opening 52 is used in the above epoxy applying step as shown in FIG. 2D. In the epoxy applying step, the screen 51 is laid on a substrate 30 such that the opening 52 is placed on the chip mounting portion of the substrate 30. Thereafter, epoxy 40 is dispensed onto the opening 52 by, for example, a conventional dispenser (not shown) thus dotting the epoxy 40 on the substrate 30. The dotted epoxy 40 in turn is bladed by a printing blade 53 thereby easily forming a predetermined thickness of epoxy layer on the substrate 30.

In the present invention, it is preferable to let an appropriate amount of epoxy 40, which forms a fillet suitable to prevent infiltration of moisture into the chip 10, be smoothly pushed out of the bottom edge of the semiconductor chip 10 when the chip 10 is mounted on the substrate 30. The above object can be achieved by making the area of the screen's opening 52 be either almost equal to or larger than that of the semiconductor chip 10.

The above screen 51 may be selected from screens formed of various materials if the materials of the screens are noncompatible with the insulating epoxy 40. For example, a thin plate formed of polyester, steel or aluminum may be preferably used as the screen 51. In addition, the thickness of the screen 51 may be appropriately selected in accordance with the height of the gold bump 20 of the flip chip 1. However, as the height of the gold bump 20 will be somewhat reduced when the flip chip 1 is mounted to the substrate 30, it is necessary to make the screen 51 be at least thicker than the height of the gold bump 20 of the chip 1 thereby effectively preventing voids from being formed in the epoxy layer 40.

In the present invention, a multi-stepped curing epoxy, which contain monomers having both different numbers of carbons and different substitution groups and are polymerized at different temperatures to be cured, may be preferably used as the epoxy 40 because such multi-stepped curing epoxy effectively prevents thermal stress from being concentrated on the gold bump 20. Alternatively, a snap curing epoxy may be used as the epoxy 40 because the snap curing epoxy can effectively reduce the processing time and simplify the process. In addition, transparent epoxy may be preferably used as the epoxy 40 since such epoxy allows the process to be more easily and effectively performed when electrically contacting the gold bump 20 of the flip chip 1 to the pattern of the substrate 30. That is, the epoxy 40 used in the present invention may be preferably selected from transparent multi-stepped curing epoxy and transparent snap curing epoxy. Representative examples of such epoxy are ABLESTIX® XP Series and ABLEBOND® Series produced by Ablestix Laboratories, a branch of National Starch & Chemical Company. Of course, it should be understood that there exist various types of typical epoxy which yield the same result as described above without affecting the functioning of this invention.

Figure 2E:
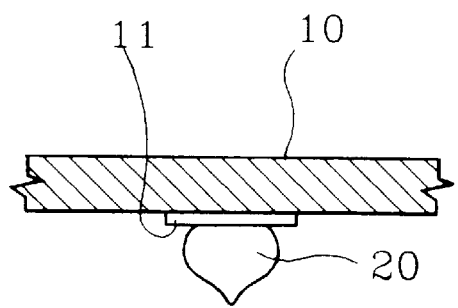
Figure 2E:
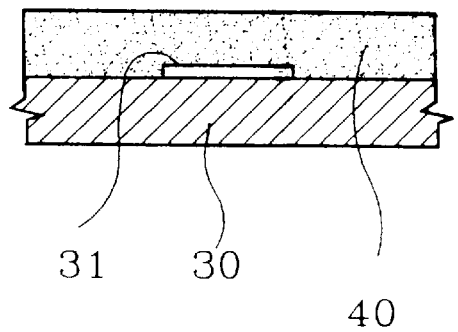

FIG. 2E shows an example of a selective precuring step of the chip bonding process of the present invention. As shown in the drawing, the multi-stepped curing epoxy 40 of the substrate 30 is precured prior to mounting the flip chip 1 to the substrate 30. When the epoxy 40 is precured as described above, the thermal stress generated during the flip chip bonding process can be distributed to both the gold bump 20 and the precured epoxy 40, so the gold bump 20 can be effectively protected from the thermal stress.

Figure 2F:
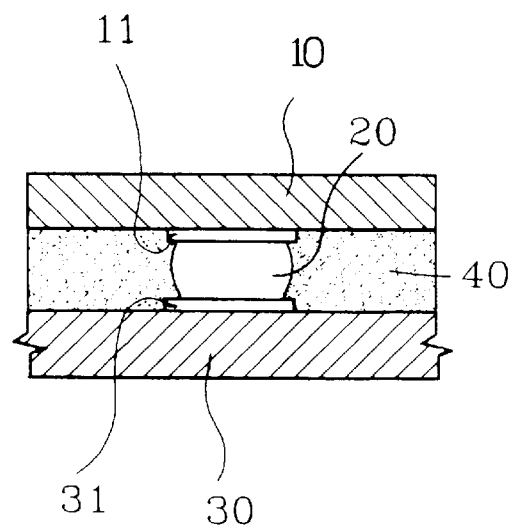

The precuring step is followed by an electrical contact step shown in FIG. 2F. In the electrical contact step, the flip chip 1 with the gold bump 20 is turned over and placed on the substrate 30 such that the gold bump 20 is aligned with the lead finger 31 of the substrate 30. The flip chip 1 and the substrate 30 in the above state are, thereafter, compressed together through thermocompression bonding, thereby bringing the gold bump 20 into electrical contact with the substrate 30.

Lastly, a permanent curing step is carried out. In the permanent curing step, the package as electrically contacted above is put in an oven thereby permanently curing the epoxy 40.

As described above, the present invention provides an improved semiconductor chip bonding process. In the above process, an epoxy layer having a predetermined area and uniform thickness is formed on the chip mounting portion of a substrate through screen printing. The process thus prevents voids from being formed in the epoxy layer when mounting the semiconductor chip to the substrate, thereby increasing the production yield and improving the operational reliability of the resulting semiconductor packages. Due to the precured epoxy, thermal stress generated during or just after the thermocompression bonding step of the chip is effectively distributed to both the gold bump of the chip and the precured epoxy. In this regard, the process of this invention prevents deformation or damage of the gold bump, uniforming the quality and improving the production yield of the packages.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A process for bonding a semiconductor chip to a substrate comprising:

providing a semiconductor chip including spaced aluminum bond pads;

forming a gold bump having a bump height directly on each of the aluminum bond pads of said semiconductor chip thereby forming a flip chip;

providing a substrate having a chip mounting portion including spaced lead fingers;

providing a screen having a first thickness and an opening;

placing the screen on the substrate such that the opening is placed over the chip mounting portion of the substrate;

dispensing insulating epoxy into said opening in order to dot the insulating epoxy on the substrate;

blading the epoxy with a printing blade in order to form an epoxy layer across said opening, said layer having a uniform thickness on the substrate, said uniform thickness being thicker than the bump height;

removing the screen from the substrate;

placing the flip chip on said substrate and into the epoxy layer such that each gold bump of the chip is brought into electrical contact with a corresponding lead finger of the substrate while preventing formation of voids in the epoxy layer;

thermally compressing the chip and substrate together through thermocompression bonding in order to bond the chip to the substrate by the epoxy layer; and then permanently curing the epoxy layer.

2. The process according to claim 1, wherein the insulating epoxy is a multi-stepped curing epoxy and precuring the epoxy layer prior to each gold bump being brought into electrical contact thereby allowing thermal stress generated during and just after the thermocompression bonding to be distributed to each of the gold bumps and the precured epoxy layer and preventing deformation or damage of the gold bumps.

3. The process according to claim 1, wherein the insulating epoxy is a snap curing epoxy suitable to reduce processing time and to simplify the process.

4. The process according to claim 1, wherein said opening of the screen has an area not smaller than the area of the semiconductor chip; and further comprising pushing out an amount of insulating epoxy by a bottom edge of the chip while mounting the chip to the substrate, thereby forming a fillet suitable to prevent infiltration of moisture into the chip.

\* \* \* \* \*